United States Patent
Oberhuber et al.

(10) Patent No.: US 7,508,027 B2
(45) Date of Patent: Mar. 24, 2009

(54) SINGLE-POLY EPROM DEVICE AND METHOD OF MANUFACTURING

(75) Inventors: Ralph Oberhuber, Kumhausen (DE); Reiner Jumpertz, Freising (DE)

(73) Assignee: Texas Instruments Incorporated, Dallas, TX (US)

( * ) Notice: Subject to any disclaimer, the term of this patent is extended or adjusted under 35 U.S.C. 154(b) by 150 days.

(21) Appl. No.: 11/467,752

(22) Filed: Aug. 28, 2006

(65) Prior Publication Data

US 2007/0048939 A1 Mar. 1, 2007

(30) Foreign Application Priority Data

Aug. 29, 2005 (DE) .................. 10 2005 040 847

(51) Int. Cl.
*H01L 29/788* (2006.01)
(52) U.S. Cl. ................ 257/318; 257/320; 257/E27.078
(58) Field of Classification Search ......... 257/315–321, 257/E27.078; 438/257–267
See application file for complete search history.

(56) References Cited

U.S. PATENT DOCUMENTS

| 4,649,520 | A |   | 3/1987  | Eitan               |
|-----------|---|---|---------|---------------------|
| 5,480,820 | A | * | 1/1996  | Roth et al. ........ 438/257 |
| 5,886,378 | A |   | 3/1999  | Wang                |
| 5,895,945 | A | * | 4/1999  | Pan et al. .......... 257/300 |
| 6,627,947 | B1|   | 9/2003  | Hu et al.           |
| 6,794,236 | B1|   | 9/2004  | Hu                  |
| 2004/0062108 | A1 | | 4/2004 | Dray et al.         |
| 2004/0217415 | A1 | | 11/2004| Mitros              |

* cited by examiner

*Primary Examiner*—Richard A. Booth
(74) *Attorney, Agent, or Firm*—Wade J. Brady, III; Frederick J. Telecky, Jr.

(57) ABSTRACT

The invention relates to a single-poly EPROM comprising a source, a drain, a control gate, a floating gate and an additional gate. The control gate is positioned laterally of a channel between the source and the drain. The floating gate is positioned above the channel above the control gate. The additional gate is positioned above the floating gate, wherein the additional gate is electrically connected to the control gate.

8 Claims, 6 Drawing Sheets

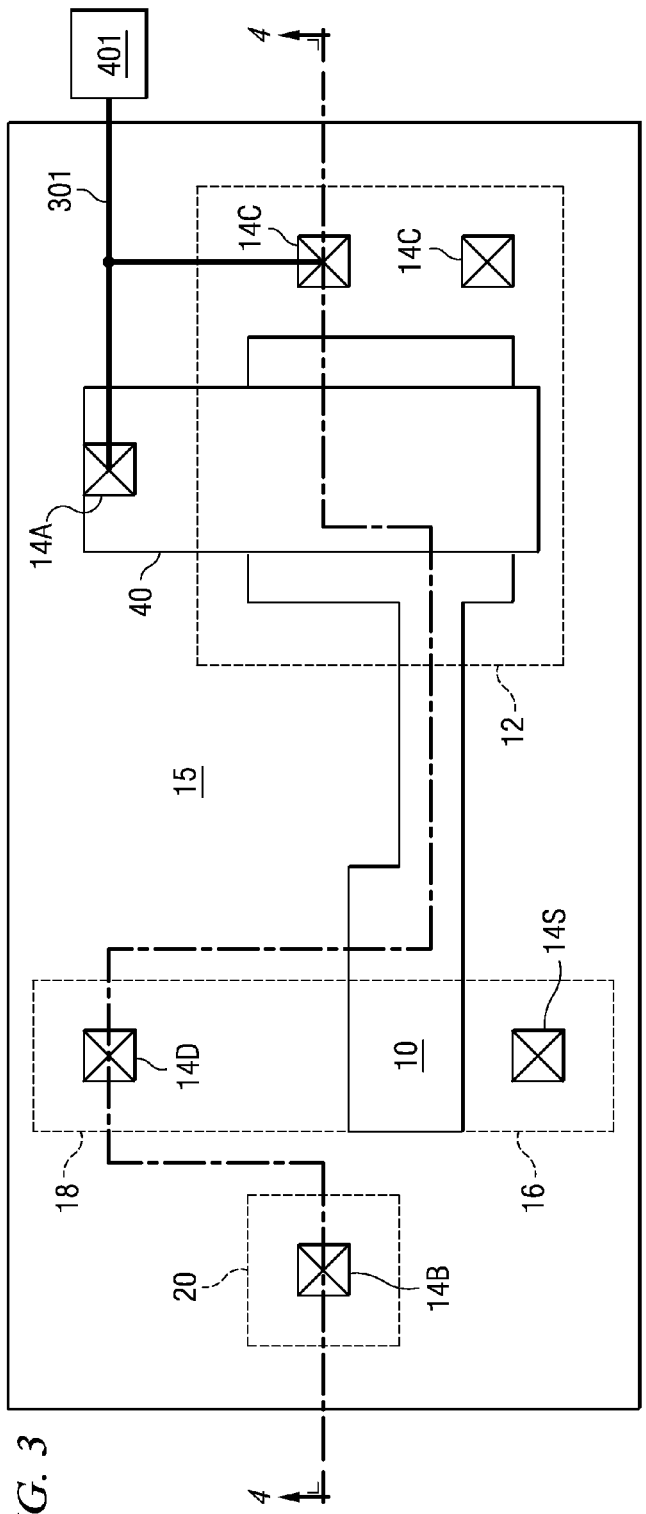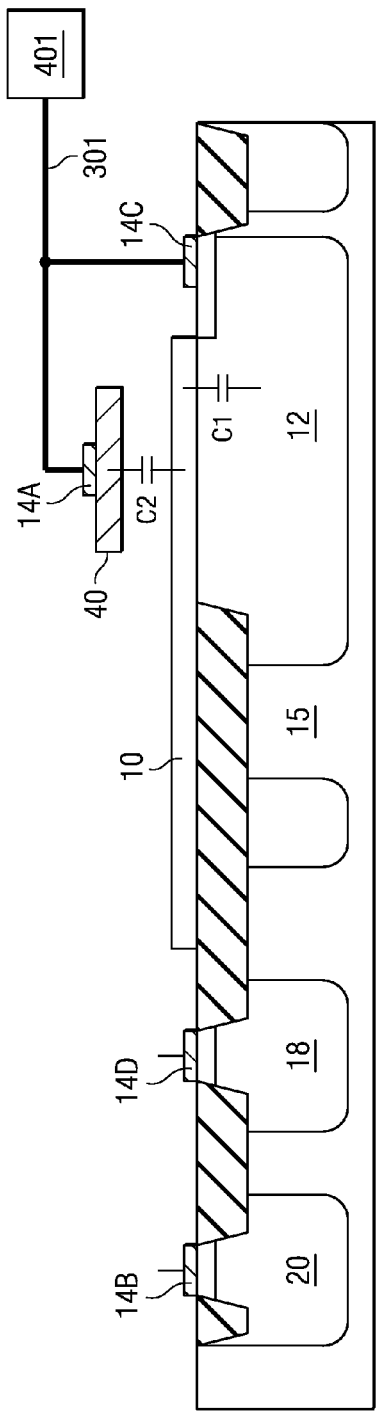
FIG. 3
FIG. 4

700

SINGLE-POLY EPROM DEVICE AND METHOD OF MANUFACTURING

The invention relates to a single-poly EPROM device and a method for its manufacture.

BACKGROUND

The term EPROM stands for electrically programmable read-only memory. In contrast to a random access memory (RAM), an EPROM comprises a memory which retains information even if the power supply to the memory is switched off. The EPROM device comprises a field effect transistor having a source, a drain and a conduction channel between the source and drain. Additionally, the field effect transistor has a gate floating above the channel. The floating gate is electrically isolated. Information is stored by injecting charges on the floating gate. Due to its isolation, the charges remain on the floating gate, even if the power supply is switched off. The charges on the floating gate effect the conductance of the channel between the source and the drain of the field effect transistor. The information may be retrieved from the memory device by measuring the current flowing between the source and the drain.

A schematic depiction of a more advanced EPROM device, called single-poly EPROM device, is given in FIGS. 1 and 2. FIG. 1 shows a top view of the single-poly EPROM device. The single-poly EPROM device of FIG. 1 comprises a floating gate 10, a control gate 12, a source 16 and a drain 18. Source 16, drain 18 and floating gate 10 form a field effect transistor (usually called a "read transistor"), wherein the floating gate 10 represents the gate of the field effect transistor. The channel between source 16 and drain 18 is covered by part of the floating gate 10 in FIG. 1. A back gate contact 14b, a drain contact 14D, and a source contact 14S are respectively connected to a back gate 20, the source 18 and the drain 16. A peculiarity of the illustrated single-poly EPROM device is that the control gate 12 is not formed by a conductive layer on top of the floating gate 10, but by a doped semiconductor region underlying part of the floating gate 10. The floating gate 10 is made out of a polysilicon ("poly") layer on top of both the channel of the field effect transistor and the control gate 12. Two control gate contacts 14C are connected to the control gate 12 (although a simple control gate is sufficient for functionality).

FIG. 2 shows a schematic cross section of the single-poly EPROM device of FIG. 1. The floating gate 10 is situated above both the control gate 12 and the channel between source 16 and drain 18. The back gate 20 shown in FIG. 2 has the same purpose as in standard MOS transistors. Reference numeral C1 depicts the capacitance between the floating gate 10 and the control gate 12 of the single-poly EPROM device shown in FIG. 2. Single-poly EPROM devices can be programmed either through hot carrier injection or Fowler-Nordheim tunneling. A thin gate oxide is provided as insulator between the floating gate 10 and the channel region. The channel region can be used for tunneling between the floating gate 10 and source 16/drain 18.

In a conventional single-poly EPROM, the floating gate 10 is controlled by a large (n–) well diffusion which is placed under a large area fraction of the floating poly, i.e., the control gate 12 of FIG. 1. This area has to be large, because the coupling ratio is approximately given by the overlap area divided by the read transistor active area. Therefore, single-poly EPROM cells usually cover a large silicon area, which is 5 to 20 times larger than double poly EPROMs.

SUMMARY

The invention relates to a single-poly EPROM comprising a source, a drain, a control gate, a floating gate and an additional gate. The control gate is positioned laterally of a channel between the source and the drain. The floating gate is positioned above the channel, and above the control gate. The additional gate is positioned above the floating gate, wherein the additional gate is electrically connected to the control gate, and the additional gate and the floating gate are separated by an insulating layer.

This approach preferably adds another capacitance on top of the floating poly, i.e., the floating gate, and connects it to the same potential as the control gate. This leads to a higher coupling ratio between the floating gate and the control gate.

In a single-poly process, the additional top capacitance can be constructed by TiN, and the capacitance formed by the top plate and the floating gate can be manufactured in the same way as a conventional TiN-poly capacitance. An advantage of this approach is that the additional capacitance adds to the coupling ratio so the resulting structure has a higher coupling ratio for the same silicon area. Hence, no change or additional step in the process is required.

Another advantage of the solution set forth herein is that a single poly (E)EPROM can be built providing the same coupling ratio, but consuming a smaller area than the conventional (E)EPROM.

Alternatively, in a split gate (double poly process), the additional top capacitance can be constructed in the second poly layer.

In a further embodiment, the EPROM device is an erasable EPROM (EEPROM) device.

In an advanced embodiment, the floating gate has a fingered or a meandering shape. In particular, the floating gate and the additional gate can be an interdigitated structure.

In yet a further embodiment, the additional gate comprises portions above and portions between the fingers of the floating gate, wherein the additional gate and the floating gate are separated by an insulating layer.

According to an advanced embodiment, the floating gate comprises a gate oxide and a polysilicon layer. Furthermore, the control gate can be arranged as an n-well in a substrate. In addition, the additional gate can be of polysilicon or TiN.

An advantage of this approach is that the polysilicon sidewalls can contribute to the effective capacitor area, first between the top plate and the bottom poly plate and second between the bottom poly plate and the well diffusion. Hence, the control gate capacitance and therefore the coupling ratio can be further increased. Depending on the poly thickness and the poly finger spacing of the meandering shape, the net capacitor values can be doubled.

The invention further relates to a method of manufacturing a single-poly EPROM device, comprising the following steps: a) forming a first insulating layer above a substrate comprising a region with a control gate; b) forming a floating gate conducting layer above the first insulating layer; c) patterning the first insulating layer and the floating gate conducting layer into a fingered or meandering shape; d) forming a second insulating layer above and covering the sides of the structure obtained in step c); e) forming an additional gate layer above and into gaps between the sides of the second insulating layer; and f) electrically connecting the additional gate layer and the control gate. In an advanced embodiment, the control gate is doped prior to step d).

This method of manufacturing allows an economical modification of existing processes. The sequence of defining the CMOS transistor gates and the poly capacitor plates has to be changed. The CMOS gate will be defined earlier and the top capacitor plate will be etched at the end. At this point the gates are protected by the capacitor insulator which provides good selective etch behavior.

BRIEF DESCRIPTION OF THE DRAWINGS

Embodiments of the invention are described with reference to accompanying drawings, wherein:

FIG. 3 illustrates schematically a top view of a single-poly EPROM device according to an example embodiment of the invention;

FIG. 4 shows a schematic cross section of the single-poly EPROM device of FIG. 3;

DETAILED DESCRIPTION OF EMBODIMENTS

Figure 1:
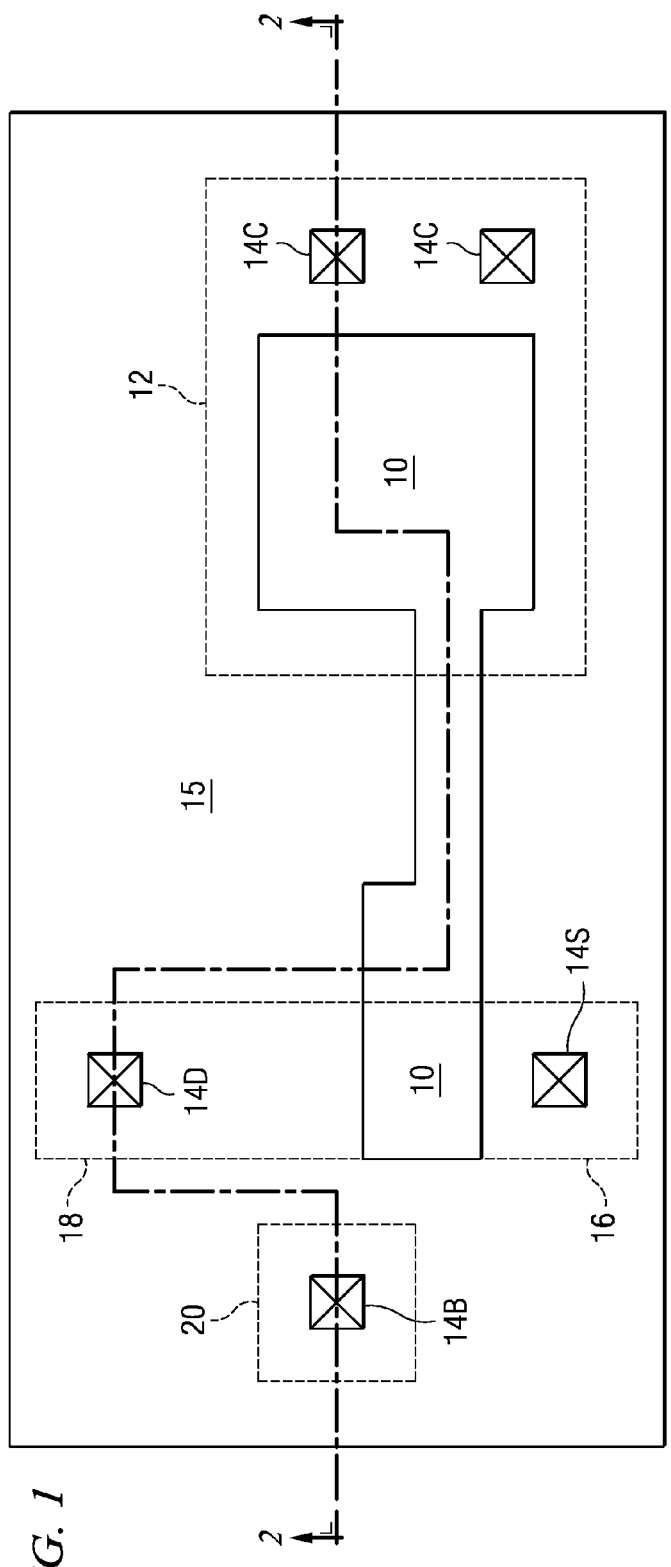
FIG. 1 is a schematic top view of a conventional single-poly EPROM device.
Figure 2:
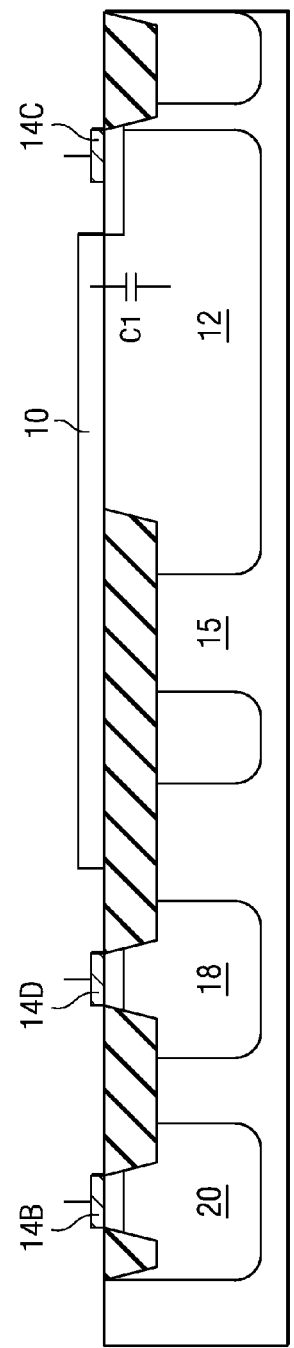
FIG. 2 is a schematic cross section of the single-poly EPROM device shown in FIG. 1.

The single-poly EPROM device according to the embodiment of FIG. 3 comprises an additional gate 40, a floating gate 10 and a control gate 12. A section of the floating gate 10 is positioned between the additional gate 40 and the control gate 12. In other words, this section of the floating gate 10 is sandwiched between the control gate 12 and the additional gate 40. Both the additional gate 40 and the control gate 12 have contacts, namely an additional gate contact 14A and a gate contact 14C, whereas the floating gate 10 is completely isolated. Furthermore, the single-poly EPROM device of FIG. 3 comprises a source 16 and a drain 18. A channel between source 16 and drain 18 is covered by a section of the floating gate 10. Therefore, the floating gate 10 controls the conductivity of the channel.

The floating gate 10, the drain 18 and the source 16 constitute a field effect transistor. Preferably, the field effect transistor is a metal-oxide semiconductor FET having an n-channel (enhancement MOSFET). In this case, both the drain 18 and the source 16 are n-doped. The channel between source 16 and drain 18 is p-doped. A silicon dioxide layer insulates the floating gate 10 from the n-channel.

The floating gate 10 is made out of polysilicon. The additional gate 40 is either made out of a second polysilicon layer or a TiN-layer (although any conducting layer can be used). Silicon dioxide layers isolate the additional gate 40 from the floating gate 10, and the control gate 12 from the floating gate 10. The source 16, the drain 18 and the control gate 12 constitute n-doped areas within a p-doped bulk area 15. A back gate 20 is connected to the bulk area 15. The purpose of a back gate 20 is the same as in conventional integrated MOSFET devices.

The additional gate contact 14A and a gate contact 14C are electrically connected by structure 301, thereby connecting the additional gate 40 with the control gate 12. This leads to a higher coupling ratio between the floating gate and the control gate.

FIG. 4 shows schematically a cross section of the single-poly EPROM device shown in FIG. 3. The control gate 12 is positioned laterally to the drain 18. Both areas are n-doped. The floating gate 10 is made out of polysilicon and is positioned above both the drain 18 and the control gate 12 shown in FIG. 4. The floating gate 10 is electrically isolated from the control gate 12. Reference numeral C1 depicts a capacitance between the control gate 12 and the floating gate 10. Furthermore, the additional gate 40 is positioned above the floating gate 10, and the additional gate 40 is electrically isolated from the floating gate 10 by means of a preferably thin insulating layer. Reference numeral C2 depicts the capacitance between the additional gate 40 and the floating gate 10. The capacitances C1 and C2 are connected in series with each other. The additional gate 40 and the control gate 12 are electrically connected, constituting a common control gate 401.

Figure 5:
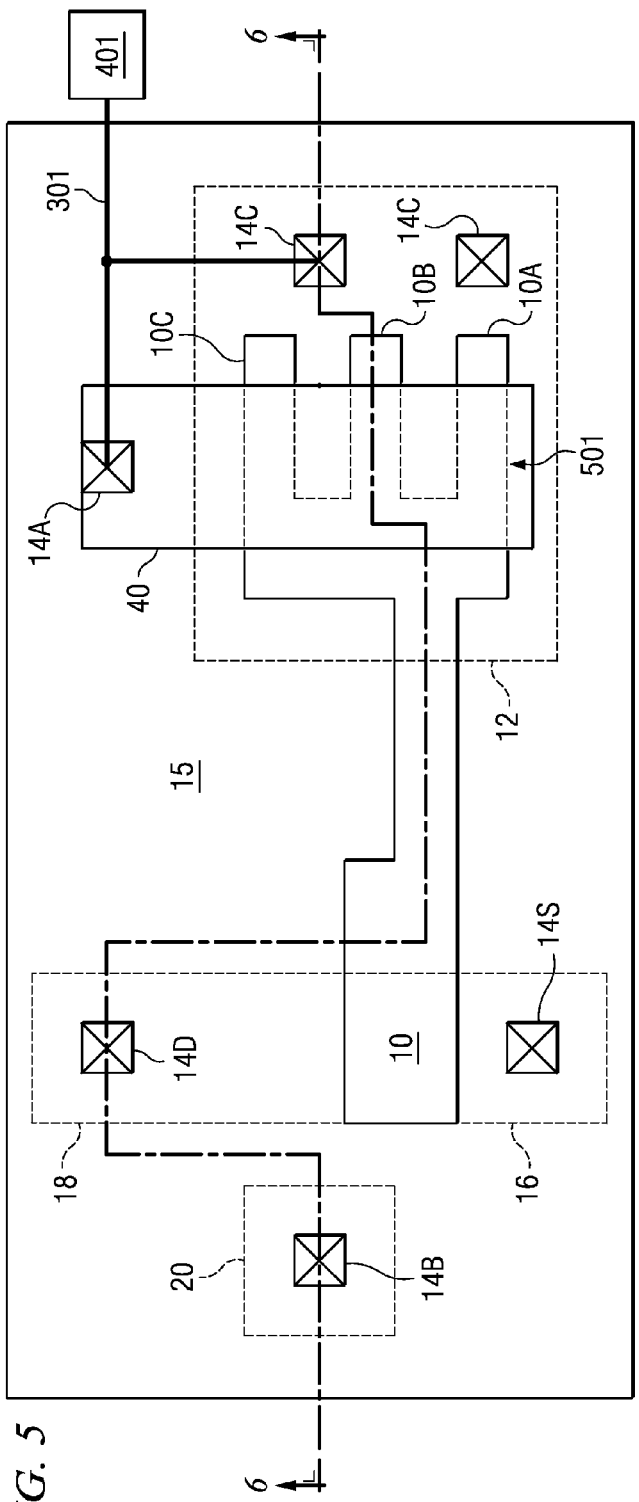
FIG. 5 illustrates schematically a top view of a single-poly EPROM device according to an example embodiment of the invention, wherein the floating gate has a fingered shape.

In addition to FIG. 4, FIG. 5 shows a floating gate 10 with a fingered shape 501. This fingered shape allows the polysilicon sidewalls of the floating gate 10 to contribute to the effective capacitor area. This increases the gate capacitance as well as the coupling ratio.

Figure 6:
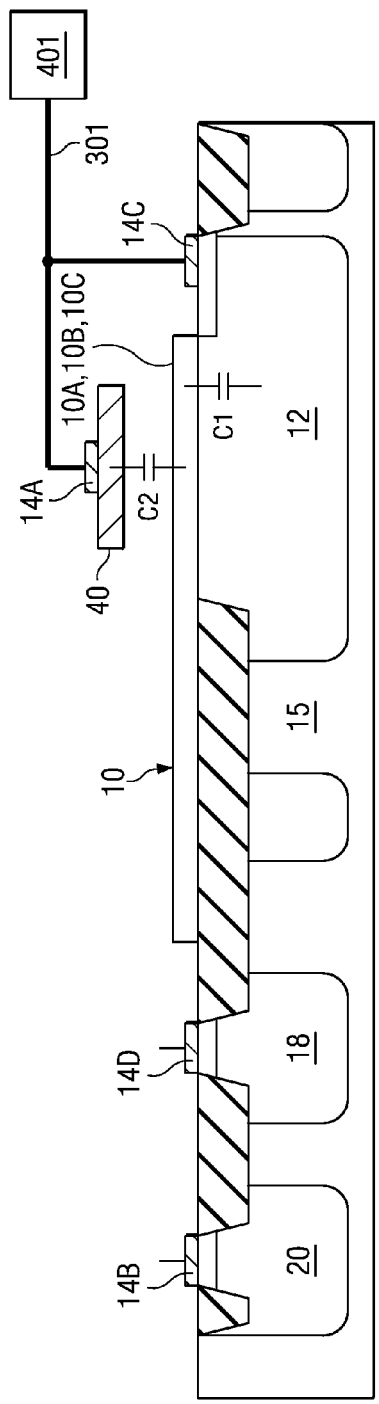
FIG. 6 shows a schematic cross section of the single-poly EPROM device of FIG. 5.

FIG. 6 schematically shows a cross section of the single-poly EPROM device of FIG. 5. The view of FIG. 6 is similar to that of FIG. 4, except that the floating gate 10 comprises (in this cross section view) several floating gate fingers 10a, 10b and 10c, each of which contributes to the overall capacitance and coupling ratio.

Figure 7:
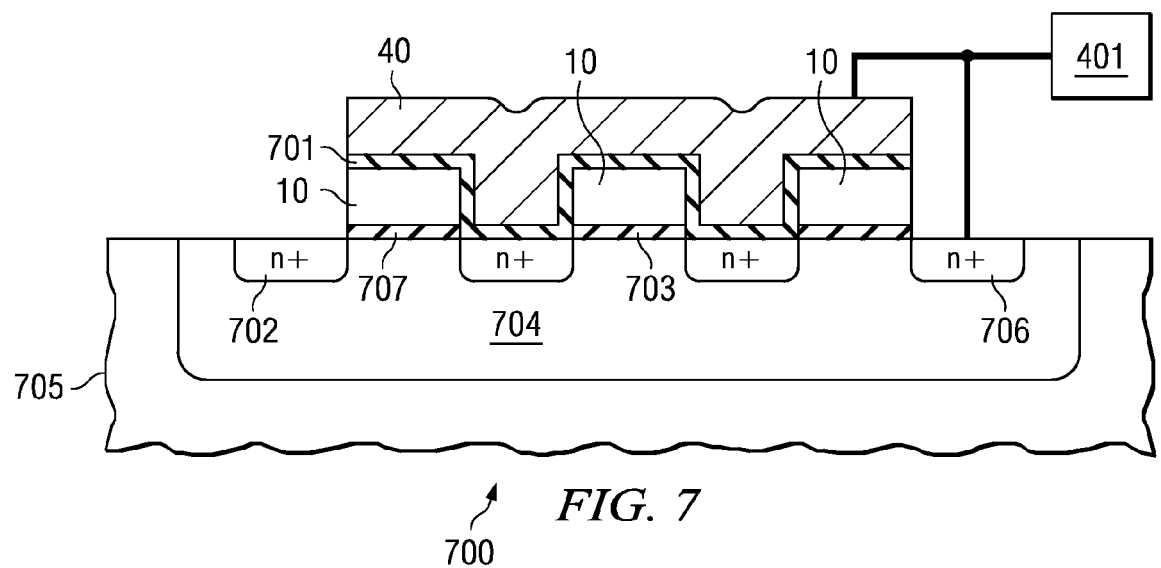
FIG. 7 shows a schematic cross sectional view through the fingers of the floating gate of the embodiment shown in FIG. 5.
Figure 8A:
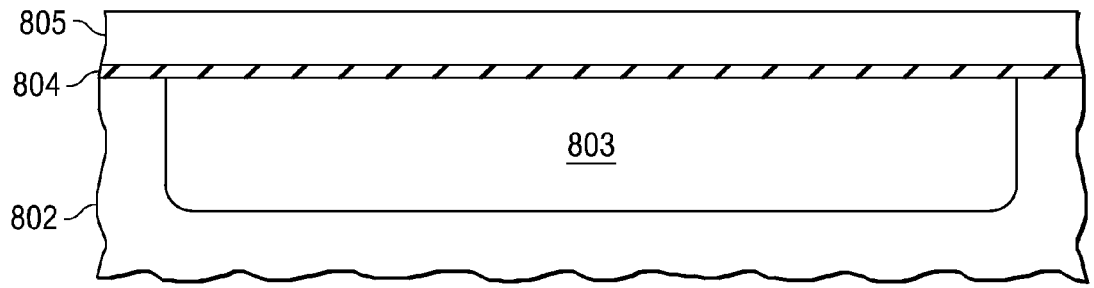
FIGS. 8A-8C and 9A-9C show schematic cross sections of steps of an example method of manufacturing a single-poly EPROM device.
Figure 8B:
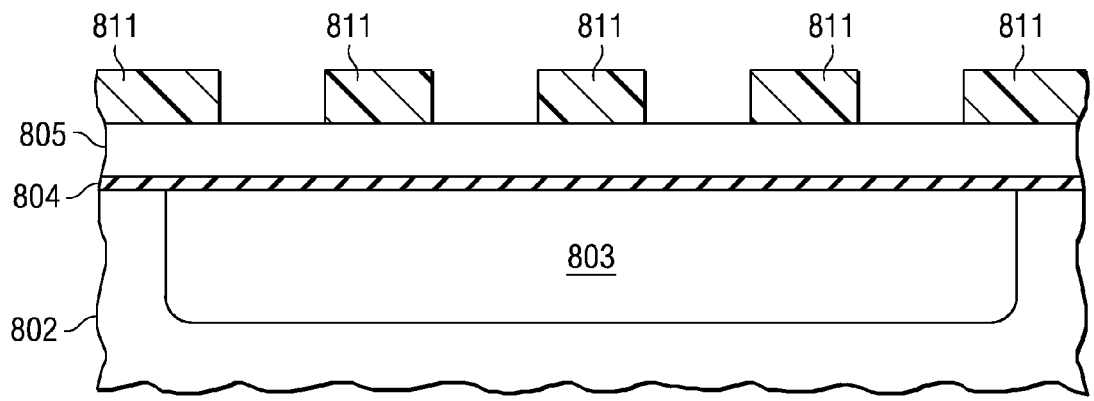
Figure 8C:
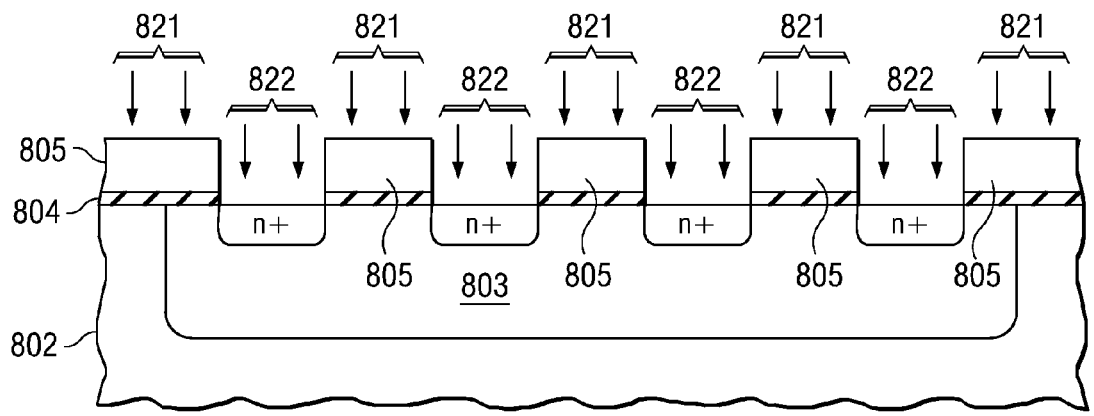
Figure 9A:
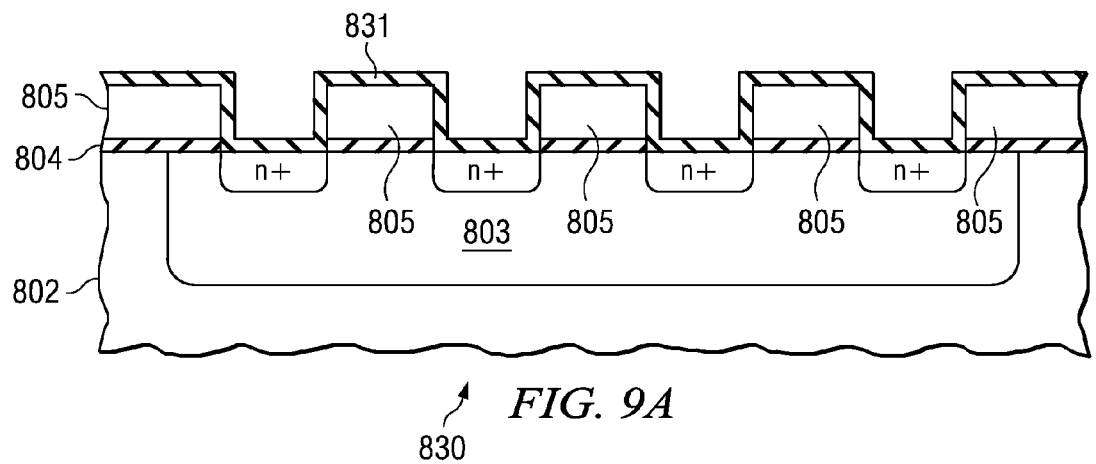
Figure 9B:
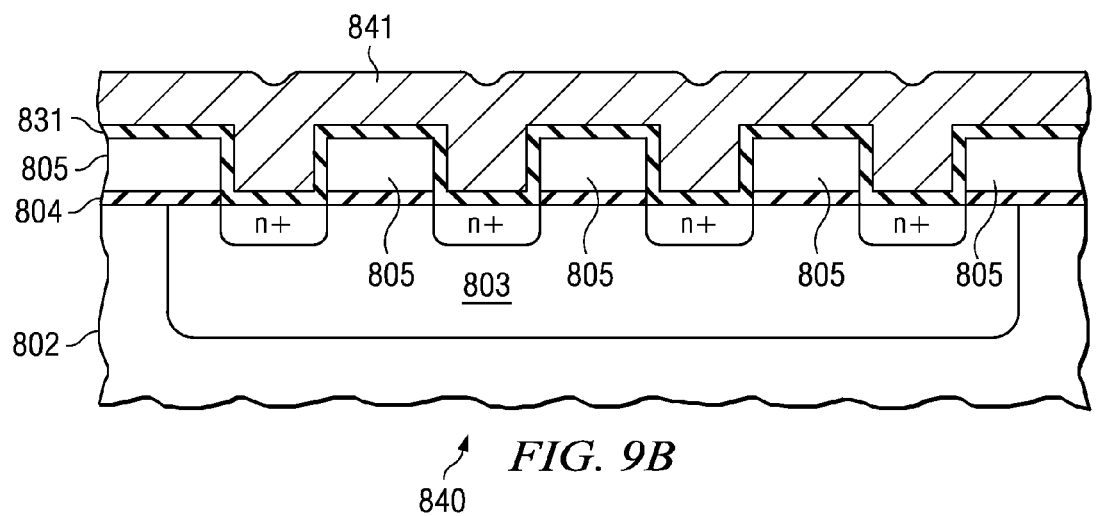
Figure 9C:
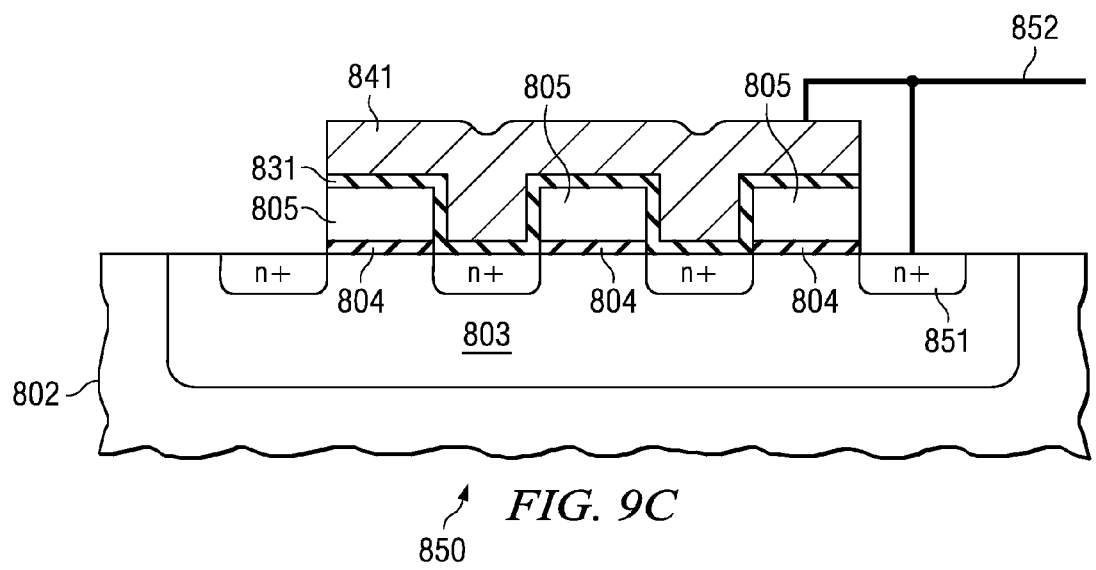

In FIG. 7 a cross-sectional view through the fingers of the floating gate 10 is shown. An n-doped well 704 is arranged within a silicon substrate 705. Areas 702 are n+ doped. The floating poly layer of the floating gate 10 is covered by an insulator 701 above of which the additional gate 40 is arranged. The additional gate 40 comprises portions above and portions between the fingers of the floating gate 10, both additional gate 40 and floating gate 10 being separated by the insulator 701. Between the fingers, the additional gate 40 is insulated from the n+ areas 702 by a gate oxide insulator 707. The control gate is connected to one n+ area 706 and to the additional gate 40. The floating gate 10 is isolated from the n-doped well 704 by an insulating layer 703, which is preferably a thin dielectric such as a conventional gate oxide.

FIGS. 8A-8C and 9A-9C show the steps of a method of manufacturing a single-poly EPROM device.

Step 800 (FIG. 8A) shows a silicon substrate 802 with an n-well area 803. A gate oxide 804 is arranged above the substrate 802 with the n-well area 803 and a polysilicon layer 805 is arranged above the oxide 804.

In step 810 (FIG. 8B), a photoresist layer 811 is formed above the polysilicon layer 805. The photoresist layer is arranged such that a section without any photoresist takes turns with a photoresist-section.

Next, in step 820 (FIG. 8C), the silicon layer 805 and the gate oxide 804 are patterned by removing the photoresist layer 811 and, in those areas where no photoresist layer 811 was applied, a corresponding portion of silicon layer 805 and gate oxide 804. Hence, this step 820 reveals areas 821 with a gate oxide 804 and a silicon layer 805, and areas 822 without both such layers. Furthermore, areas 822 are n+ doped.

In a subsequent step 830 (see FIG. 9A), a second insulating layer 831 is formed above the structure obtained by step 820.

In a step 840 (FIG. 9B), a polysilicon or TiN top-plate layer 841 is formed above the second insulating layer 831 and into the gaps.

In a final step 850 (FIG. 9C), the top-plate layer 841 is electrically connected with an area 851 of n+ doping, thereby forming the control gate 852.

What is claimed is:

1. A single-poly EPROM device, comprising:
   a source;
   a drain;
   a control gate, wherein the control gate is positioned in a substrate and laterally of a channel between the source and the drain;
   a floating gate, wherein the floating gate is positioned above the channel and above the control gate; and
   an additional gate above the floating gate, wherein the additional gate is electrically connected to the control gate and the additional gate is electrically isolated from the floating gate.

2. The single-poly EPROM device according to claim 1, wherein the EPROM is an electrically erasable single-poly EPROM device.

3. The single-poly EPROM device according to claim 1, wherein the floating gate has a fingered or a meandering shape.

4. The single-poly EPROM device according to claim 1, wherein the floating gate and the additional gate are an inter-digitated structure.

5. The single-poly EPROM according to claim 4, wherein the additional gate comprises portions above and portions between the fingers of the floating gate; and wherein the additional gate and the floating gate are separated by an insulating layer.

6. The single-poly EPROM device according to claim 1, wherein the floating gate comprises a gate oxide and a polysilicon layer.

7. The single-poly EPROM device according to claim 1, wherein the control gate is arranged as an n-well in the substrate.

8. The single-poly EPROM device according to claim 1, wherein the additional gate is comprised of polysilicon or of TiN.

* * * * *